United States Patent [19]
Fun et al.

[11] Patent Number: 6,166,913
[45] Date of Patent: Dec. 26, 2000

[54] CASING FOR PC CARD

[75] Inventors: Jones Fun, Taipei Hsien; Kuo-Cheng Wang, Tu-Cheng; Steven Wang, Pen-Chiao, all of Taiwan

[73] Assignee: Hon Hai Precision Ind. Co., Ltd., Taipei Hsien, Taiwan

[21] Appl. No.: 09/114,440

[22] Filed: Jul. 13, 1998

[30] Foreign Application Priority Data

Jul. 11, 1997 [TW] Taiwan .................................. 86211659

[51] Int. Cl.[7] ..................................................... H05K 1/14
[52] U.S. Cl. ........................ 361/737; 367/736; 367/759; 367/741; 439/76.1
[58] Field of Search .................................. 361/736, 737, 361/752, 753, 754, 756, 759, 800, 801, 802; 434/76.1

[56] References Cited

U.S. PATENT DOCUMENTS

| | | | |
|---|---|---|---|
| 5,053,613 | 10/1991 | Onoda | 235/492 |
| 5,242,310 | 9/1993 | Leung | 439/76 |
| 5,278,445 | 1/1994 | Umera et al. | 257/678 |
| 5,330,360 | 7/1994 | Marsh et al. | 439/76 |
| 5,339,222 | 8/1994 | Simmons et al. | 361/818 |
| 5,414,253 | 5/1995 | Baudouin et al. | 235/492 |
| 5,490,043 | 2/1996 | Tan et al. | 361/818 |
| 5,505,628 | 4/1996 | Ramey et al. | 439/76.1 |
| 5,726,867 | 3/1998 | Zarreii | 361/818 |
| 6,058,018 | 5/2000 | Gerrits et al. | 361/737 |

*Primary Examiner*—Jeffery Gaffin
*Assistant Examiner*—Tuan Dinh

[57] ABSTRACT

A casing for enclosing a circuit board comprises pair of symmetrical halves assembled together. Each said half forms plurality of retaining means on a first longitudinal side thereof and plurality of receiving means at a second longitudinal side opposite said first longitudinal side whereby said halves are fixedly assembled together by the interlocking engagement between said retaining means and said receiving means.

4 Claims, 3 Drawing Sheets

CASING FOR PC CARD

FIELD OF THE INVENTION

The present invention relates to a casing, and particularly to a casing for enclosing a circuit board such as a printed circuit board therein and having two halves thereof. Each half has symmetrical retaining means and receiving means interlocked together to ensure a reliable seal along the perimeter between the upper and lower halves.

DESCRIPTION OF THE PRIOR ART

I/O cards provide all the functional options and flexibility of conventional expansion cards except that the I/O card is encased within a thin, compact unit facilitating insertion and withdrawal from a connecting device such as an I/O card connecting cartridge. The I/O card may carry a great deal of data accessed by the computer system such as a lap top computer.

The conventional I/O card includes upper and lower shells interlocked together. Each shell further includes an insulating frame for positioning a circuit board together with a connector encapsulated within the shells. Normally the shells are made from a metal sheet for providing shielding from electromagnetic interference (EMI).

The connection between the upper and lower halves is attained through different method.

U.S. Pat. Nos. 5,242,310, 5,481,434, and 5,502,982 disclose a super-sonic welding process to connect the shells. However, the high vibrating frequency and heat generated during the welding process may damage the chips on the circuit board.

U.S. Pat. No. 5,339,222 suggests a crimping or riveting process to connect the shells. However, such a process may not ensure a complete seal along the perimeter of the shells and a gap therebetween permits EMI noise to effect the circuit board. The data transmission between the I/O card and the computer system is thus adversely affected. Furthermore, the I/O card is frequently inserted and withdrawn from an I/O card connecting cartridge which deteriorates the seal along the perimeter of the shells. Therefore, the I/O card will eventually be rendered functionless.

SUMMARY OF THE INVENTION

The objective of the present invention is to provide a casing for a circuit board, having symmetrical upper and lower halves thereby facilitating the formation of a reliable seal therebetween.

Another objective of the present invention is to provide a casing for a circuit board, and comprising a pair of halves, each including a plurality of retainers and fasteners thereby facilitating the formation of a complete seal along the perimeter of the shells.

In order to achieve the objectives set forth, a casing for enclosing a circuit board in accordance with the present invention comprises a pair of symmetrical halves assembled together. Each the half forms a plurality of retaining means on a first longitudinal side thereof and a plurality of receiving means on a second longitudinal side opposite to the first longitudinal side whereby the halves are fixedly assembled together by the interlocking engagement between the retaining means and the receiving means.

These and additional objects, features, and advantages of the present invention will become apparent after reading the following detailed description of the preferred embodiment of the invention taken in conjunction with the appended drawing.

DETAILED DESCRIPTION OF PREFERRED EMBODIMENT

Figure 1:
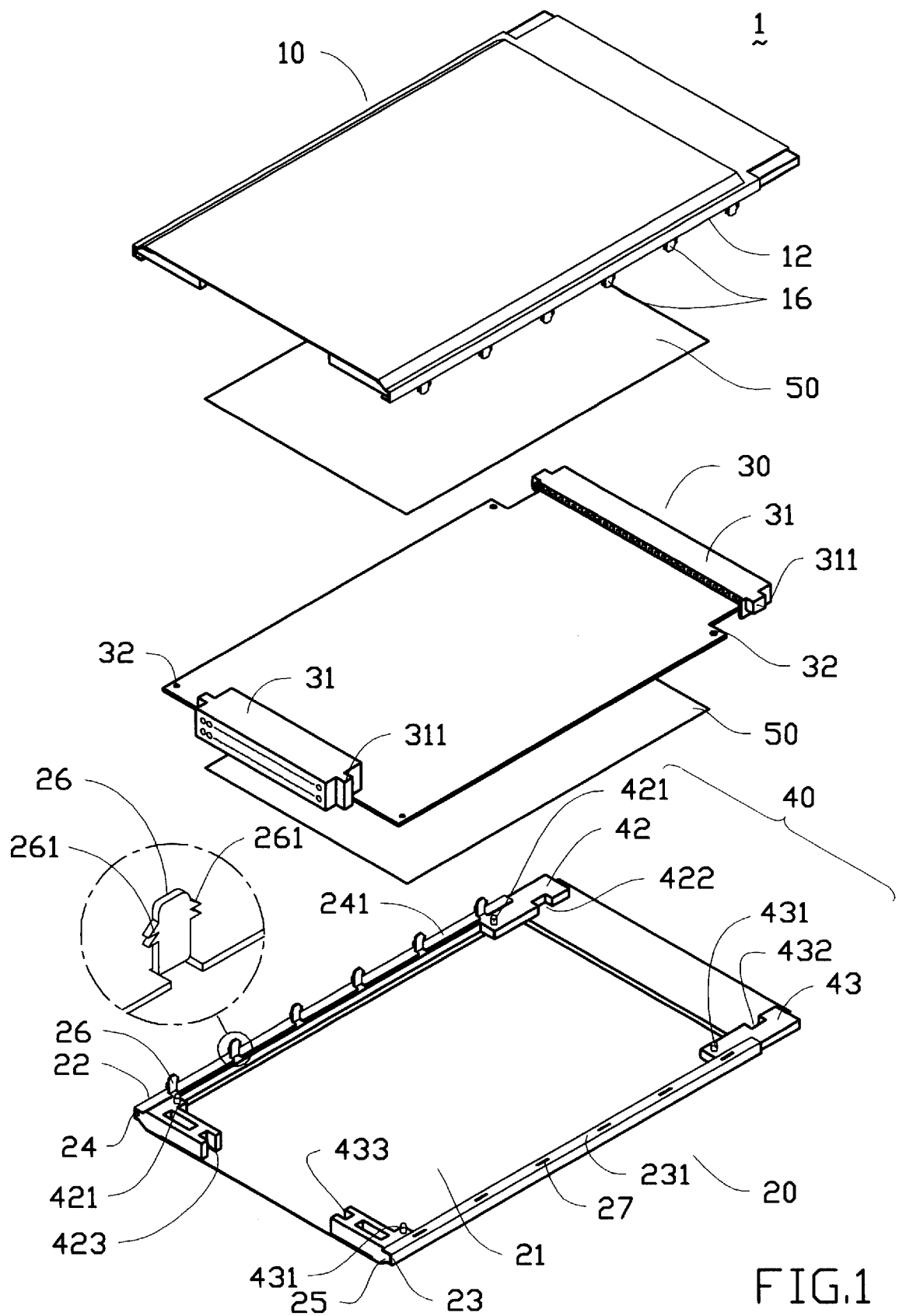
FIG. 1 is an exploded view of an I/O card incorporating the casing in accordance with the present invention.

Referring to FIG. 1, a casing 1 in accordance with the present invention includes an upper half 10 and a lower half 20. The upper and lower halves 10, 20 have the same configuration thereby only the lower half 20 will be described in detail. The lower half 20 is directly stamped from a metal sheet and has a rectangular shape. The lower half 20 defines a recess 21 in a central region between first and second longitudinal sides 22, 23 thereof. A first retaining groove 24 and a second retaining groove 25 are respectively defined along the first and second longitudinal sides 22, 23. The first retaining groove 24 forms a plurality of spaced clipping tabs 26 extending vertically from a sidewall 241 thereof. Each clipping tab 26 is formed with barbs 261 extending from both sides thereof.

The second retaining groove 25 defines a plurality of retaining receptacles 27 in a sidewall 231 thereof. Each receptacle 27 is arranged to align with a corresponding clipping tab 16 on the first retaining groove 12 of the top half 10 and is shaped to receive the clipping tab 16 therein. When the upper half 10 is attached to the lower half 20, the clipping tabs 16 of the upper half 10 are received within the retaining receptacles 27 of the lower half 20, while the clipping tabs 26 of the lower half 20 are received within the retaining receptacles (not shown) of the upper half 10.

Figure 3:
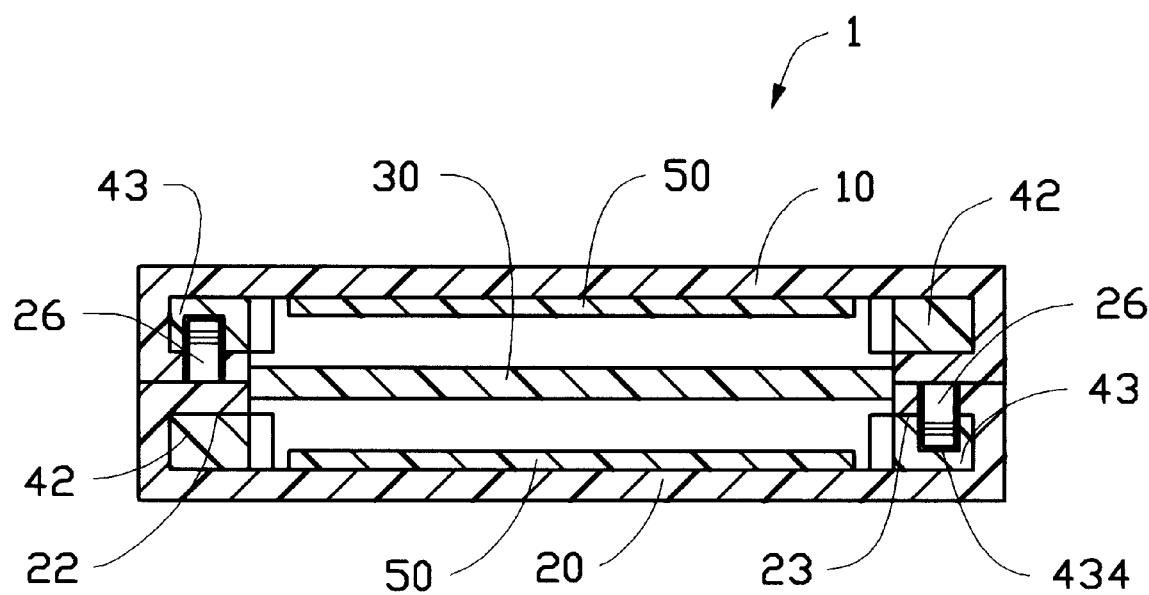
FIG. 3 is a cross sectional view of the I/O card taken from line III—III of FIG. 2.

The casing 1 encloses a circuit board 30 therein, and a positioning frame 40 accordingly supports the circuit board 30. The positioning frame 40 includes a first sub-frame 42 received and retained within the first retaining groove 24, and a second sub-frame 43 received and retained within the second retaining groove 25. Both the first and second sub-frames 42, 43 have the same configuration except that the second sub-frame 43 defines a plurality of receptacles 434 (FIG. 3) corresponding to the retaining receptacles 27 of the lower half 20. Both sub-frames 42, 43 are separately molded and then assembled to each of the upper and lower halves 10, 20. Each sub-frame 42, 43 includes a dowel post 421, 431 at each end thereof for insertion into a corresponding guiding hole 32 defined in the circuit board 30, and retaining slots 422, 432, 423, 433 for receiving a corresponding positioning tab 311 of a connector 31 mounted on the circuit board 30. By this arrangement, the printed circuit board 30 is correctly positioned onto the positioning frame 40. As a result, when the clipping tabs 16 of the upper half 10 are inserted into a corresponding retaining receptacle 27 of the lower half 20, the barb 261 will become anchored within the retaining receptacles 434 (as shown in FIG. 3) of the second sub-frame 43.

An insulating layer 50 is further disposed between the upper half 10 or lower half 20 and the circuit board 30 to prevent any short-circuit from forming therebetween.

Figure 2:
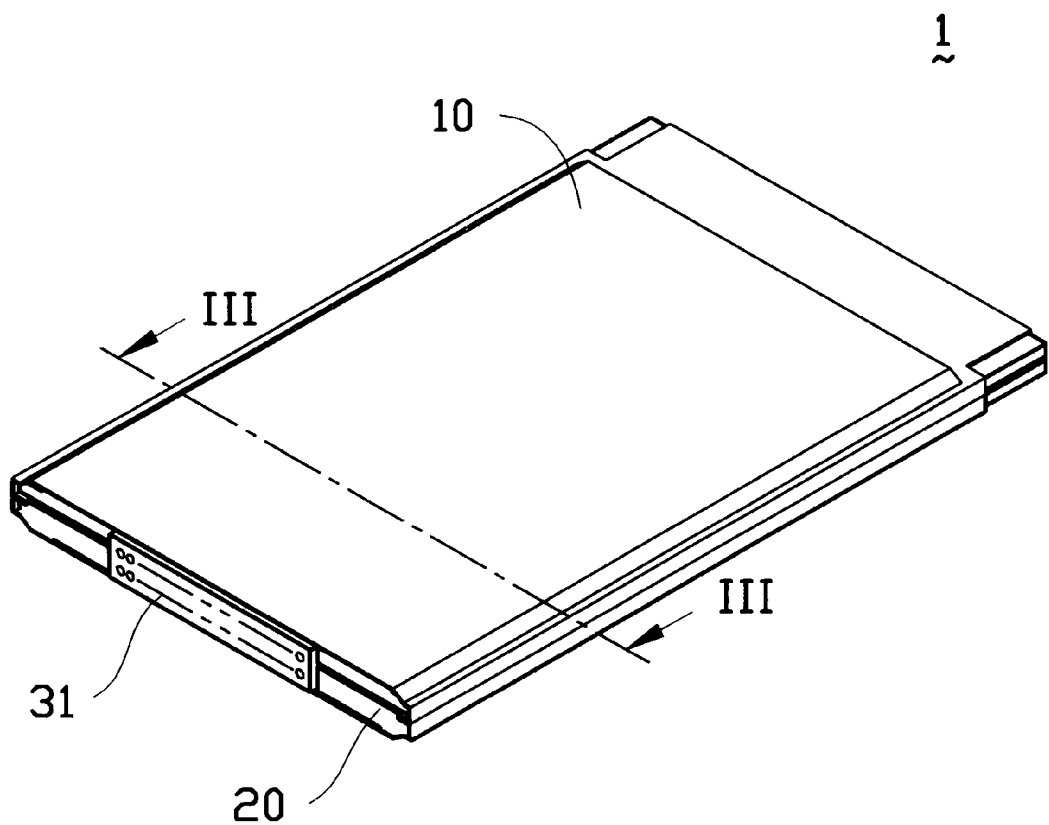
FIG. 2 is an assembled perspective view of the I/O card of FIG. 1.

In assembly, the sub-frames 42, 43 are firstly assembled to the upper and lower halves 10, 20 respectively. Then the insulating layer 50 is disposed on the recess 21 of the lower half 20 before the circuit board 30 is placed onto the positioning frame 40. After the circuit board 30 is positioned, another insulating layer 50 is placed onto the circuit board 30 before the upper half 10 is finally attached. As shown in FIG. 3, when the upper half 10 is attached, the clipping tab 16 thereof are inserted into the corresponding retaining receptacle 27 of the lower half 20 and anchors into the retaining receptacles 434 of the second sub-frame 43 located thereunder. Likewise, the clipping tabs 26 of the lower half 20 are inserted into the corresponding retaining receptacle (not shown) of the upper half 10 and are anchored into the retaining receptacles (not shown) of the second sub-frame 43 located thereunder whereby the casing 1 is fully assembled as seen in FIG. 2. As a result, a reliable seal along the perimeter of the upper and lower halves 10, 20 is attained. This is especially advantageous for providing EMI shielding while the configuration is less complicated than the prior art.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

Therefore, persons of ordinary skill in this field are to understand that all such equivalent structures are to be included within the scope of the following claims.

We claim:

1. A casing for enclosing a circuit board therein, comprising:

a pair of symmetrical halves interlocked together, each half forming first and second longitudinal sides opposite to each other, a plurality of clipping tabs formed on said first longitudinal side and a plurality of retaining receptacles defined on said second longitudinal side in a manner such that said clipping tabs on one half are aligned with said retaining receptacles on the other half, while said retaining receptacles on said one half are aligned with said clipping tabs on the other half, a pair of positioning frames respectively attaching to the pair of symmetrical halves, each positioning frame including a first and a second sub-frames, each of the second sub-frames defining a plurality of receptacles aligned with said retaining receptacles on the half of the casing to which it is attached; whereby said clipping tabs and said receptacles of the second sub-frames are interlocked together via the engagement of barbs of said clipping tabs with inner walls of said receptacles of the second sub-frames for facilitating the formation of a complete seal along a perimeter of said one and the other halves when said halves are assembled together.

2. A casing as recited in claim 1, wherein said clipping tab further comprises barbs extending from both sides thereof.

3. A PC card assembly, comprising:

a casing having a pair of symmetrical halves interlocked together, each half forming first and second longitudinal sides opposite to each other, a plurality of clipping tabs formed on said first longitudinal side and a plurality of retaining receptacles defined on said second longitudinal side in a manner such that said clipping tabs on one half are aligned with said retaining receptacles on the other half, while said retaining receptacles on said one half are aligned with said clipping tabs on the other half, each of said longitudinal sides defining a retaining groove;

a circuit board suitably enclosed within said casing; and a pair of positioning frames supporting the circuit board within the casing, each of the positioning frame including a first and a second separately molded sub-frames, the first and the second sub-frames being respectively retained in corresponding retaining grooves of the first and second longitudinal sides, respectively, of the pair of halves of the casing, each of the second sub-frames defining a plurality of receptacles aligned with said retaining receptacles on the half of the casing to which it is attached;

whereby said clipping tabs of the one and the other halves of the casing are respectively inserted through said retaining receptacles of the other and the one halves of the casing and are fixedly interlocked with inner walls of the receptacles of the second sub-frames for facilitating the formation of a complete seal along a perimeter of said one and the other halves when said halves are assembled together.

4. An assembly as recited in claim 3, further comprising an insulating layer arranged between said half and said printed circuit board.

* * * * *